United States Patent [19]

Bradley

[11] Patent Number: 5,339,049

[45] Date of Patent: Aug. 16, 1994

[54] ULTRA LOW NOISE FREQUENCY DIVIDER/MULTIPLIER

[75] Inventor: Donald A. Bradley, Morgan Hill, Calif.

[73] Assignee: Wiltron Company, Morgan Hill, Calif.

[21] Appl. No.: 51,624

[22] Filed: Apr. 22, 1993

[51] Int. Cl.⁵ ............................................. H03L 7/00
[52] U.S. Cl. ..................................... 331/16; 331/1 A; 331/17
[58] Field of Search ................ 331/1 A, 17, 16, 2, 331/25, 27, 15, 23; 332/127, 128; 455/260

[56] References Cited

U.S. PATENT DOCUMENTS

| | | | |
|---|---|---|---|
| 5,207,491 | 5/1993 | Rottingham | 331/16 |
| 5,208,555 | 5/1993 | Graham et al. | 331/17 |
| 5,266,907 | 11/1993 | Dacus | 331/1 A |
| 5,268,652 | 12/1993 | Lafon | 331/25 |
| 5,278,520 | 1/1994 | Parker et al. | 331/DIG. 2 |

Primary Examiner—Raymond A. Nelli
Attorney, Agent, or Firm—Fliesler, Dubb, Meyer & Lovejoy

[57] ABSTRACT

Frequency divider and multiplier circuits are provided comprising a voltage controlled oscillator, a presteer circuit comprising a frequency comparator, a sampling phase detector circuit comprising a sampler, a pair of prescalers for providing frequencies in the divider/multiplier circuits by a predetermined number D, a programmable divider for dividing one of the frequencies in the divider/multiplier circuits by a selectable N and a summing circuit. In operation, the presteer circuit drives the VCO toward a predetermined frequency. When the VCO reaches a predetermined frequency, the output of the presteer circuit is disabled and the sampling phase detector takes over, locking the VCO to the predetermined desired frequency.

6 Claims, 3 Drawing Sheets

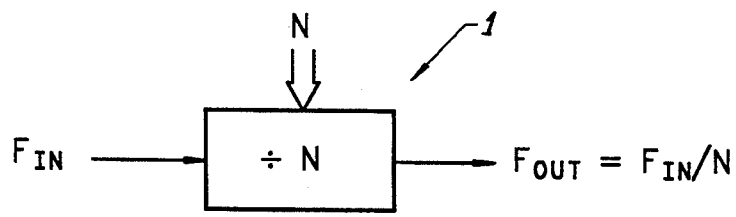
FIG. 1
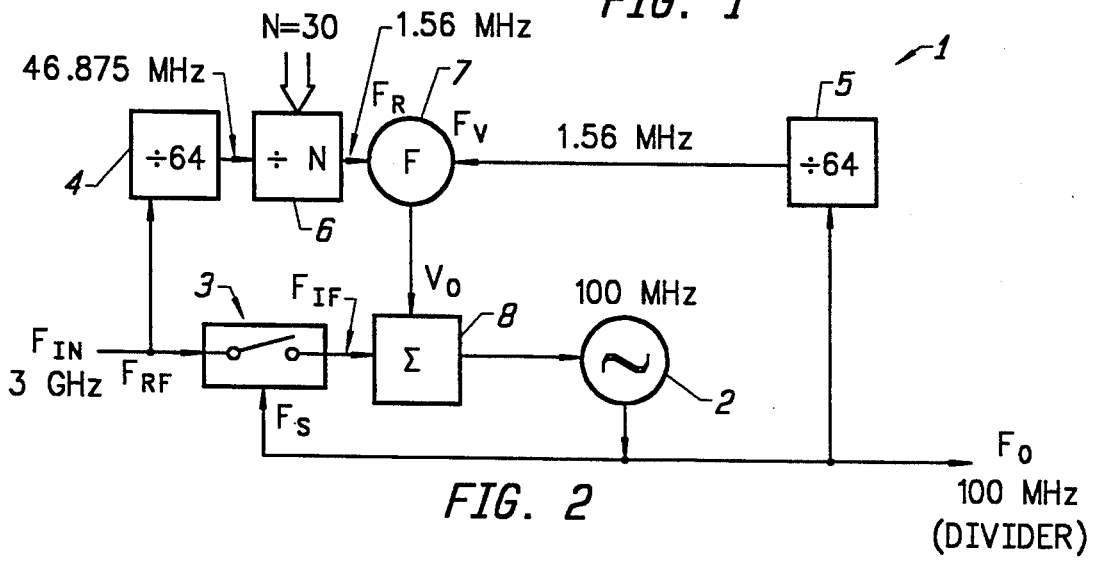
FIG. 2 (DIVIDER)
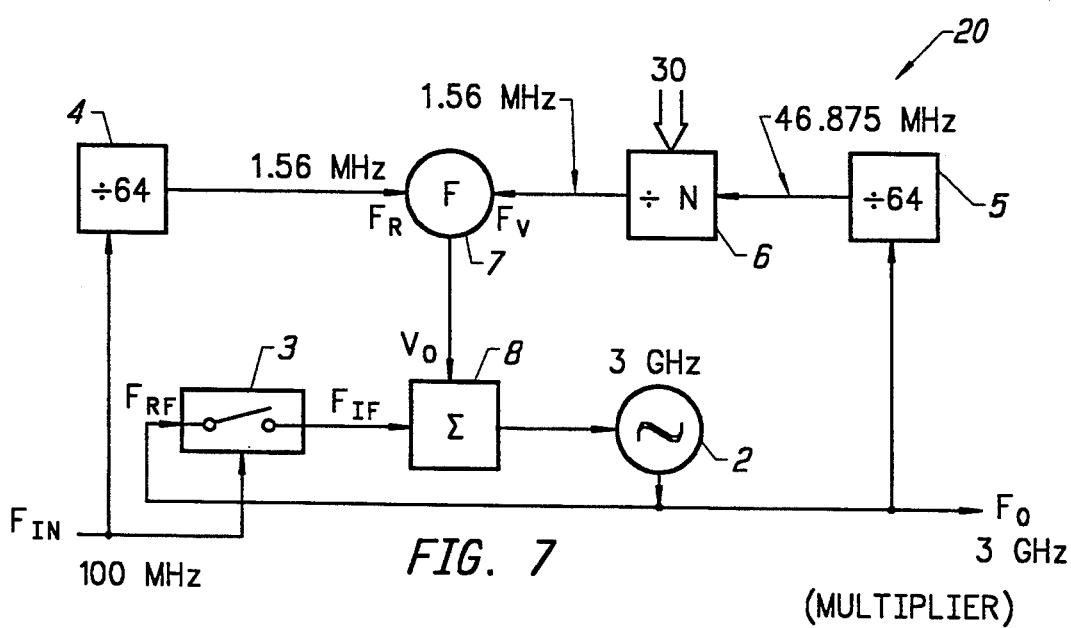
FIG. 7 (MULTIPLIER)

ULTRA LOW NOISE FREQUENCY DIVIDER/MULTIPLIER

BACKGROUND OF THE INVENTION

1. Field of the Invention

The present invention relates to microwave divider and multiplier circuits in general and in particular to ultra low noise divider and multiplier circuits for use in dividing and multiplying microwave frequencies in ultra low noise microwave synthesizers and other microwave circuits.

2. Description of the Related Art

A microwave synthesizer is a circuit which is used for generating microwave signals of any frequency within a predetermined, generally broad, range of frequencies, e.g. 2 gigahertz (GHz) to 20 GHz.

Heretofore, noise performance pertaining to synthesized microwave signal generation, in particular sources that must produce any frequency, such as a synthesizer, has been limited by digital divider noise and the multiplying nature of harmonic samplers which heretofore has increased such noise by the harmonic number H of the sampler.

Digital divider noise has heretofore been a severely limiting factor in microwave circuits because of process dependent noise floors. For convenience, noise floors are defined herein in terms of noise power, in connection with which the units dBc/Hz are used. The units dBc/Hz represent the single sideband (SSB) noise power in a one (1) Hz bandwidth offset from the carrier by 10 KHz. For example, in $T^2L$ circuits, which have a maximum operating frequency of approximately 100 megahertz (MHz), the noise floor is approximately $-160$ dBc/Hz. In MECL circuits, which have a maximum operating frequency of approximately 600 megahertz (MHz), the noise floor is approximately $-150$ dBc/Hz. In GaAs circuits, which have a maximum operating frequency of approximately 3000 MHz, i.e. 3 gigahertz (GHz), the noise floor is approximately $-130$ dBc/Hz.

SUMMARY OF THE INVENTION

In view of the foregoing, principal objects of the present invention are an ultra low noise frequency divider which is not limited by the process dependent noise floors of prior known dividers and an ultra low noise frequency multiplier for dividing and multiplying microwave frequencies.

In accordance with the above objects, each of the divider and multiplier circuits of the present invention comprises a voltage controlled oscillator (VCO), a presteer circuit comprising a frequency comparator, a sampling phase detector circuit comprising a sampler, a pair of prescalers for dividing frequencies in the divider/multiplier circuits by a predetermined number D, a programmable divider for dividing one of the frequencies in the divider/multiplier circuits by a selectable number N and a summing circuit.

The presteer circuit serves two purposes. First, it prevents the VCO from locking onto some intermediate, undesirable frequency $F_O$ corresponding to a harmonic number H of the sampler. Second, it drives, i.e. presteers, the VCO toward a predetermined desired frequency $F_O$ equal to a frequency $F_{IN}$ of an input signal divided by the selectable number N in the case of a divider or to a predetermined frequency $F_O$ equal to an input signal having a frequency $F_{IN}$ multiplied by the selectable number N in the case of a multiplier. In both cases, once the presteer circuit has driven the VCO to approximately the desired frequency $F_O$, the output current $I_O$ of the presteer circuit is terminated and the sampling phase detector circuit locks the VCO to the desired frequency $F_O$.

BRIEF DESCRIPTION OF THE DRAWINGS

The above and other objects, features and advantages of the present invention will become apparent from the following detailed description of the accompanying drawings, in which:

FIG. 1 is a generalized block diagram of a divider circuit according to the present invention;

FIG. 2 is a more detailed block diagram of a divider circuit according to the present invention;

FIG. 7 is a block diagram of a multiplier circuit according to the present invention.

DESCRIPTION OF THE PREFERRED EMBODIMENTS

Figure 3:
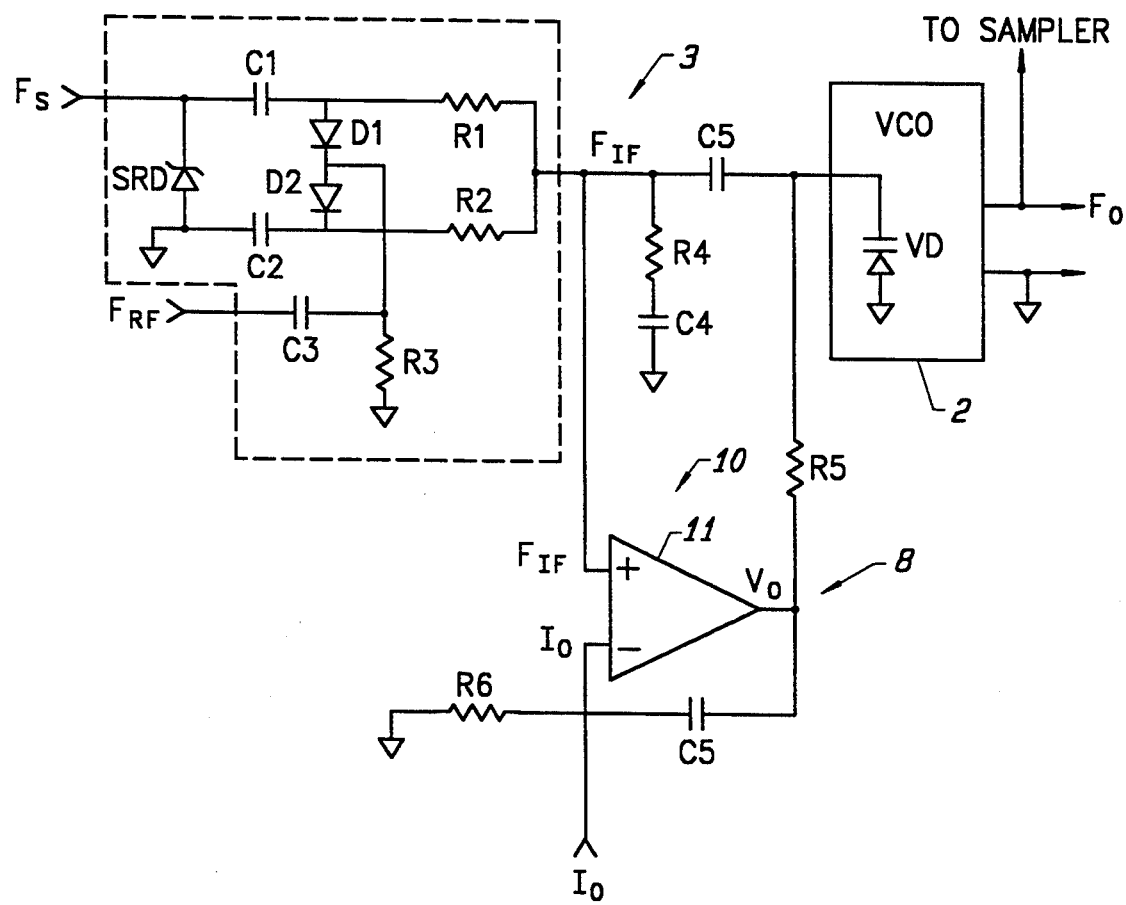
FIG. 3 is a schematic diagram of a sampling and summing circuit for providing a VCO control voltage according to the present invention.

Referring to FIG. 1, there is shown a generalized block diagram of an ultra low noise programmable divider circuit according to the present invention, designated generally as 1. In the circuit 1 there is provided an input for receiving an input signal having a frequency $F_{IN}$, an input for receiving a divider number N and an output for providing an output signal having a frequency $F_O$ equal to $F_{IN}/N$. For example, if $F_{IN}=3$ GHz and N=30, $F_O=100$ MHz. Moreover, compared to prior known $T^2L$, MECL and GaAs circuits there will be a significant drop in the noise level in the output signal. For example, if the noise in the input signal is $-150$ dBc/Hz, the noise in the output signal is $-150$ dBc/Hz$-20 \log 30$ or $-179.5$ dBc/Hz.

Referring to FIG. 2, there is provided in the divider circuit 1 a voltage controlled oscillator (VCO) 2, a sampling phase detector circuit comprising a sampler 3, a pair of prescalers 4 and 5 for dividing frequencies in the divider circuit 1 by a predetermined number D, e.g. 64, a programmable divider 6 for dividing one of the frequencies in the divider circuit 1 by a selectable number N, e.g. 30, a presteer circuit 7 and a summing circuit 8.

Referring to FIG. 3, the sampling circuit 3 comprises a step recovery diode SRD, three capacitors C1, C2 and C3, a pair of diodes D1 and D2 and a plurality of resistors R1, R2 and R3. The capacitor C1 and step recovery diode SRD comprise an input for a sampling input signal having a frequency $F_S$. The capacitor C3 comprises an input for receiving an input signal having a frequency $F_{RF}$. The resistors R1 and R2 are connected at a common node for providing an output signal having an intermediate frequency $F_{IF}$.

The resistors R1 and R2 are coupled in common to a resistor R4 and a capacitor C4 coupled to ground and through a capacitor C5 to the control voltage input of the VCO 2 having a varactor diode VD.

The output of the sampler 3 is coupled to an operational amplifier circuit 10 comprising an operational amplifier 11 having a non-inverting input (+) and an inverting input (−). The output of the amplifier 11 comprising a control voltage $V_O$ is coupled to the control voltage input of the VCO 2 by means of a resistor R5, to its inverting input by means of a capacitor C5 and to ground by means of a resistor R6. The inverting input of the amplifier 11 and resistor R6 are also coupled to the output of the presteer circuit 7 for receiving an output current $I_O$, the magnitude of which is a function of the difference between frequencies $F_R$ and $F_V$ being compared in the presteer circuit 7, as will be described below.

Figure 4:
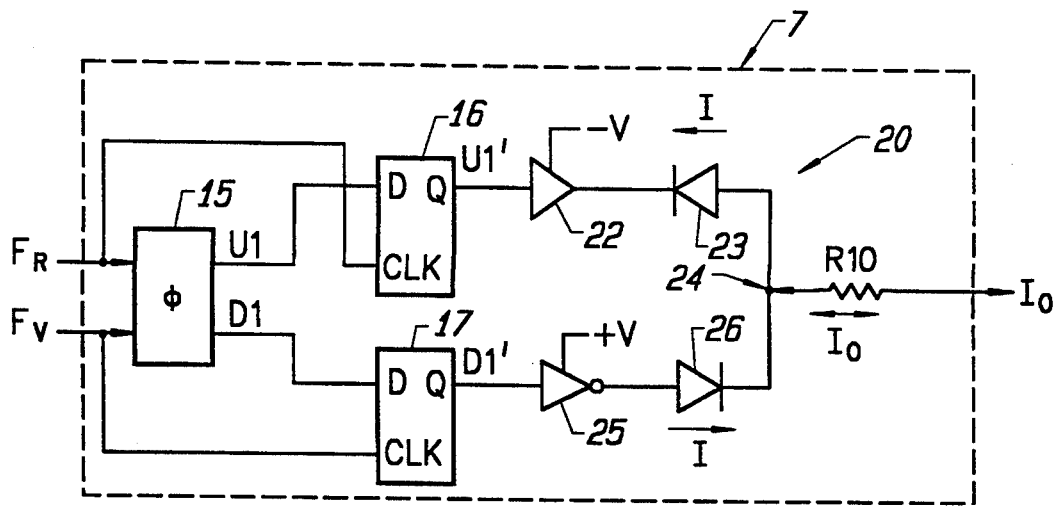
FIG. 4 is a block diagram of a frequency comparator and presteer circuit according to the present invention.

Referring to FIG. 4, there is provided in the presteer circuit 7 a frequency comparator 15 such as found in Motorola Part No. MC4044, which is responsive to a signal having a frequency $F_R$ and a signal having a frequency $F_V$ for providing a first plurality of pulses U1 when the frequency $F_R$ is greater than the frequency $F_V$ and a second plurality of pulses D1 when the frequency $F_V$ is greater than the frequency $F_R$. The pulses U1 are fed to the D input of a D flip-flop 16. The pulses D1 are applied to the D input of a D flip-flop 17. The signal having the frequency $F_R$ is also applied to the clock input of the D flip-flop 16 and the signal having the frequency $F_V$ is also applied to the clock input of the D flip-flop 17. The Q outputs of the flip-flops 16 and 17 are coupled to a charge pump designated generally as 20 for providing the output current $I_O$. The charge pump 20 comprises a buffer 22 which is coupled to the Q output of the flip-flop 16 and which has an input coupled to a source of negative potential $-V$. The output of the buffer 22 is coupled to the cathode of a diode 23. The anode of the diode 23 is coupled to a resistor R10 at a common node 24. The Q output of the flip-flop 17 is coupled to an inverter 25 which also has an input coupled to a source of positive potential $+V$. The output of the inverter 25 is coupled to the anode of a diode 26 and the cathode of the diode 26 is coupled to the resistor R10 at the common node 24.

Referring again to FIG. 2, the operation of the frequency divider 1 will now be described. For purposes of the description, each of the prescalers 4 and 5 is provided to divide the frequency of its input signal by the number D wherein D=64. The programmable divider 6 is programmed to divide the frequency of its input signal by the number N, wherein N=30. The output of the VCO is coupled to the sampling input of the sampler 3 such that $F_S = F_O$. Accordingly, the frequency divider 1 will provide an output signal having a frequency $F_O$ equal to the frequency FIN of the input signal divided by N.

To provide an output signal having a frequency $F_O$ equal to 100 MHz from an input signal having a frequency $F_N$ equal to 3 GHz, the input signal is applied to the $F_{RF}$ input of the sampler 3 and the prescaler 4. The sampler 3 samples the 3 GHz input signal at the frequency of the oscillator 2 which is nominally 100 MHz for providing an output signal having a frequency $F_{IF}$. As is well known, the operation of samplers, such as sampler 3, is such that the frequency $F_{IF}$ will be zero whenever the sampling frequency is a subharmonic of the input frequency. In the prescaler 4, the input frequency is divided by 64 for providing an output frequency of 46.875 MHz. In the programmable divider 6, the output frequency of the prescaler 4 is further divided by 30 to provide an output frequency $F_R$ equal to 1.56 MHz. At the same time, the output of the VCO 2 having a frequency $F_O$ is divided by the prescaler 5 to provide an output frequency $F_V$.

If the output frequency $F_O$ of the VCO 2 is 100 MHz, the frequency $F_V$ will also be 1.56 MHz such that the frequency $F_R$ and the frequency $F_V$ are equal. When the frequency $F_R$ and $F_V$ are equal, the output current $I_O$ of the presteer circuit 7 is terminated and the sampling phase detector comprising the sampler 3 detects and removes any phase difference between the corresponding signal locking the VCO 2 to 100 MHz. At this point it may be noted that the output current $I_O$ of the presteer circuit 7 will remain terminated, i.e. its magnitude will remain zero, so long as $F_R = F_V$ regardless of the relative phase of the corresponding signals. This is illustrated by the $\pm 2\pi$ dead zone in FIG. 5.

Figure 5:
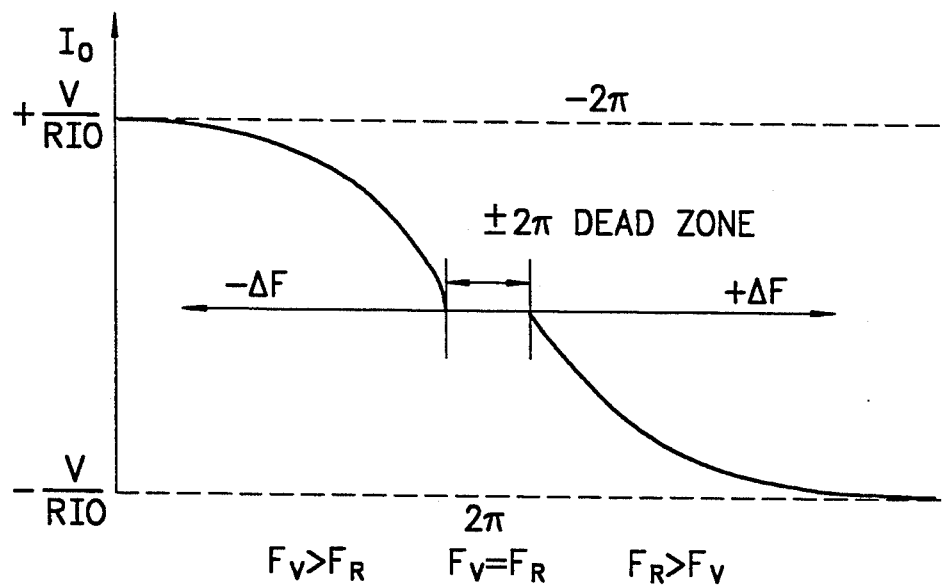
FIG. 5 is a diagram of output current $I_O$ versus frequency difference in the frequency comparator and presteer circuit of FIG. 4.
Figure 6:
FIG. 6 is a diagram of VCO control voltage $V_O$ at the control voltage input of the VCO of FIG. 3.

On the other hand, if the frequency VCO 2 is greater than 100 MHz, the frequency $F_V$ will be greater than the frequency $F_R$ producing, as shown in FIG. 5, a positive current $I_O$ in the resistor R10 producing, as shown in FIG. 6, a negative voltage $V_O$ at the control voltage input of the VCO causing the frequency of the VCO 2 to decrease. As the frequency of the VCO 2 decreases to a point where the frequency $F_V$ equals the frequency $F_R$, the presteer circuit 7 is disabled, i.e. the output current $I_O$ is terminated, and remains so regardless of the relative phase of the two signals. At this point, as shown by the dead zone in FIG. 5, the phase dependent output of the sampler 3 takes over to lock the VCO 2 to the desired frequency $F_O$.

Conversely, if the frequency of the VCO 2 is lower than the desired frequency of 100 MHz, the frequency $F_R$ is greater than the frequency $F_V$. In this circumstance, the charge pump 20 generates a negative current $I_O$ in the resistor R10 producing a control voltage $V_O$ on the VCO which drives the VCO to a higher frequency. Once again, when the frequency of the VCO is such that the frequency $F_R = F_V$, the output $I_O$ of the presteer circuit 7 is terminated and the frequency of the VCO is locked to the desired frequency by the output of the sampler 3.

Referring to FIG. 7, there is provided in accordance with the present invention a multiplier circuit designated generally as 20 which comprises all of the circuits described above with respect to the divider circuit 1 of FIG. 2. The only difference between the two circuits is that the programmable divider 6 is inserted between the presteer circuit 7 and the prescaler 5, the input signal having the frequency FIN is applied to the input of the prescaler 4 and the sampling input of the sampler 3 and the output signal of the VCO 2 having the frequency $F_O$ is applied to the $F_{RF}$ input of the sampler 3. In all respects, each of the circuits in the multiplier 20 operate in the same fashion as described above with respect to the divider 1. That is to say, if the frequency of the VCO is above or below the desired output frequency $F_O$, the presteer circuit 7 compares the frequencies $F_R$ and $F_V$ and drives the VCO 2 to a frequency such that the frequencies $F_R$ and $F_V$ become equal. When the frequencies $F_R$ and $F_V$ become equal, the current output $I_O$ of the presteer circuit 7 is terminated and the output $F_{IF}$ of the sampler 3 locks the VCO at the desired frequency.

While preferred embodiments of the present invention are described above, it is contemplated that numerous modifications may be made thereto for particular applications without departing from the spirit and scope of the present invention. For example, various numbers D can be used for the prescalers 4 and 5, various numbers N can be used for the programmable divider 6, and input signals of any frequency $F_{IN}$ can be divided and multiplied. Accordingly, it is intended that the embodiments described be considered only as illustrative of the present invention and that the scope thereof should not be limited thereto but be determined by reference to the claims hereinafter provided.

What is claimed is:

1. A frequency divider comprising:
   a voltage controlled oscillator having an input for receiving a control voltage and an output for providing an output signal having a frequency $F_O$;
   first means for dividing the frequency $F_{IN}$ of an input signal by a predetermined number D for providing a signal having a frequency $F_{IN}/D$;
   second means for dividing the frequency $F_{IN}/D$ by a predetermined number N for providing a signal having a frequency $F_R$, said second means including a programmable dividing means;
   third means for dividing the output signal having the frequency $F_O$ by the predetermined number D for providing a signal having a frequency $F_V$;
   means for sampling the input signal having the frequency $F_{IN}$ at the frequency $F_O$ for providing an intermediate signal having an intermediate frequency $F_{IF}$, wherein $F_{IF}=0$ when $F_O=F_{IN}/N$;
   means responsive to the frequencies $F_R$ and $F_V$ for providing an error signal having a polarity and magnitude corresponding to the difference between the frequencies $F_R$ and $F_V$; and
   means responsive to the error signal and the signal having the frequency $F_{IF}$ for providing a control voltage for locking the VCO at the frequency $F_O$ wherein $F_O$ is equal to $F_{IN}/N$.

2. A frequency multiplier comprising:
   a voltage controlled oscillator having an input for receiving a control voltage and an output for providing an output signal having a frequency $F_O$;
   first means for dividing the frequency $F_O$ by a predetermined number D for providing a signal having a frequency $F_O/D$;
   second means for dividing the frequency $F_O/D$ by a predetermined number N for providing a signal having a frequency $F_V$, said second means including a programmable dividing means;
   third means for dividing the frequency of an input signal having a frequency $F_{IN}$ by the predetermined number D for providing a signal having a frequency $F_R$;
   means for sampling the output signal having the frequency $F_O$ at the frequency $F_{IN}$ for providing a signal having an intermediate frequency $F_{IF}$, wherein $F_{IF}=0$ when $F_O$ is equal to the product of $F_{IN}$ and N;
   means responsive to the frequencies $F_R$ and $F_V$ for providing an error signal having a polarity and magnitude corresponding to the difference between the frequencies $F_R$ and $F_V$; and
   means responsive to the error signal and the signal having the frequency $F_{IF}$ for providing a control voltage for locking the VCO at the frequency $F_O$ when $F_O$ is the product of $F_{IN}$ and N.

3. A frequency divider according to claim 1 wherein said error signal providing means comprises means for providing a first plurality of pulses at a predetermined rate when the frequency $F_R$ is greater than the frequency $F_V$ and a second plurality of pulses at a predetermined rate when the frequency $F_V$ is greater than the frequency $F_R$, the magnitude of said predetermined rate corresponding to the magnitude of the difference between the frequencies $F_R$ and $F_V$; and said control voltage providing means comprises means responsive to said first plurality of pulses for increasing the frequency of the VCO to a frequency $F_O$ wherein $F_O$ is less than but not equal to $F_{IN}/N$ and to said second plurality of pulses for decreasing the frequency of the VCO to a frequency $F_O$ wherein $F_O$ is greater than but not equal to $F_{IN}/N$.

4. A frequency multiplier according to claim 2 wherein said error signal providing means comprises means for providing a first plurality of pulses at a predetermined rate when the frequency $F_R$ is greater than the frequency $F_V$ and a second plurality of pulses at a predetermined rate when the frequency $F_V$ is greater than the frequency $F_R$, the magnitude of said predetermined rate corresponding to the magnitude of the difference between the frequencies $F_R$ and $F_V$; and said control voltage providing means comprises means responsive to said first plurality of pulses for increasing the frequency of the VCO to a frequency $F_O$ when $F_O$ is less than but not equal to the product of $F_{IN}$ and N and to said second plurality of pulses for decreasing the frequency of the VCO to a frequency $F_O$ when $F_O$ is equal to the product of $F_{IN}$ and N.

5. A frequency divider according to claim 3 wherein said means for providing said first and said second plurality of pulses comprises means for preventing said first and second plurality of pulses when said frequency $F_O=F_{IN}/N$.

6. A frequency multiplier according to claim 4 wherein said means for providing said first and said second plurality of pulses comprises means for preventing said first and second plurality of pulses when said frequency $F_O$ equals the product of $F_{IN}$ and N.

* * * * *